United States Patent
Standing

(10) Patent No.: US 8,686,554 B2
(45) Date of Patent: Apr. 1, 2014

(54) VERTICALLY MOUNTABLE SEMICONDUCTOR DEVICE PACKAGE

(75) Inventor: Martin Standing, Kent (GB)

(73) Assignee: International Rectifier Corporation, El Segundo, CA (US)

(*) Notice: Subject to any disclaimer, the term of this patent is extended or adjusted under 35 U.S.C. 154(b) by 443 days.

(21) Appl. No.: 12/075,825

(22) Filed: Mar. 13, 2008

(65) Prior Publication Data

US 2008/0224286 A1  Sep. 18, 2008

Related U.S. Application Data

(60) Provisional application No. 60/906,783, filed on Mar. 13, 2007.

(51) Int. Cl.
*H01L 23/12* (2006.01)

(52) U.S. Cl.
USPC ............... 257/700; 257/678; 257/E21.48

(58) Field of Classification Search
USPC ............. 257/678–733, 787, 788, E21.38, 257/E21.48, E21.499, E33.056
See application file for complete search history.

(56) References Cited

U.S. PATENT DOCUMENTS

| | | | |
|---|---|---|---|
| 5,294,897 A * | 3/1994 | Notani et al. | 333/33 |
| 6,777,800 B2 * | 8/2004 | Madrid et al. | 257/690 |
| 7,005,734 B2 * | 2/2006 | Choi et al. | 257/686 |
| 7,220,617 B2 * | 5/2007 | Kagii et al. | 438/106 |
| 7,615,852 B2 * | 11/2009 | Otremba | 257/666 |
| 2001/0048116 A1 * | 12/2001 | Standing et al. | 257/177 |
| 2004/0104489 A1 * | 6/2004 | Larking | 257/787 |
| 2004/0212057 A1 * | 10/2004 | Otremba | 257/678 |
| 2007/0007644 A1 * | 1/2007 | Zhao et al. | 257/707 |
| 2007/0040186 A1 * | 2/2007 | Fillion et al. | 257/177 |
| 2007/0096278 A1 * | 5/2007 | Nakatsu et al. | 257/678 |
| 2007/0096317 A1 * | 5/2007 | Kiyohara | 257/737 |
| 2007/0108575 A1 * | 5/2007 | Montgomery | 257/678 |
| 2007/0176266 A1 * | 8/2007 | Kawano et al. | 257/622 |

\* cited by examiner

*Primary Examiner* — Cuong Q Nguyen
*Assistant Examiner* — Yosef Gebreyesus
(74) *Attorney, Agent, or Firm* — Farjami & Farjami LLP

(57) ABSTRACT

A semiconductor package that includes a die with electrodes on opposite surfaces thereof and respective conductive clip electrically and mechanically coupled to the electrode and configured for vertical mounting of the package.

15 Claims, 5 Drawing Sheets

US 8,686,554 B2

VERTICALLY MOUNTABLE SEMICONDUCTOR DEVICE PACKAGE

RELATED APPLICATION

This application is based on and claims priority to the U.S. Provisional Application Ser. No. 60/906,783, filed on Mar. 13, 2007, entitled Vertically Mounted Semiconductor Device Package, to which a claim of priority is hereby made and the disclosure of which is incorporated by reference.

FIELD OF THE INVENTION

This invention relates to semiconductor device packages and more specifically relates to a package which is mountable to extend generally transverse to a support surface.

BACKGROUND AND SUMMARY OF THE INVENTION

Semiconductor packages for power die such as diodes, transistors, IGBTs and the like are well known. Such packages include TO220 type packages and, more recently, chip-scale type packages, shown, for example in U.S. Pat. No. 6,624,522.

As integrated circuits become more compact one factor is the footprint of a package. Furthermore, given that power devices generate heat when operated, another factor is heat dissipation.

In accordance with the invention, a semiconductor die, for example, a power MOSFET, is mounted with its drain electrode conductively fixed to the interior of a conductive drain clip. One edge of the drain clip extends beyond one edge of the die and is formed as a terminal which can be fixed to a support structure. A source clip and a gate clip are conductively fixed to the source and gate electrodes of the die respectively and each includes a terminal extending in the same direction as the drain terminal. Advantageously, a package according to the present invention can be mounted on a circuit board or the like to extend generally perpendicularly whereby both surfaces are available for cooling.

DETAILED DESCRIPTION OF THE DRAWINGS

Figure 1A:
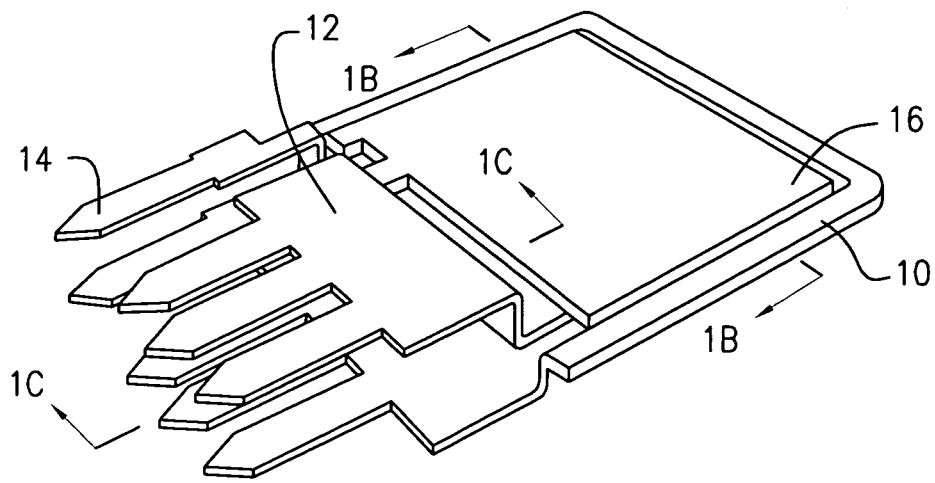
FIG. 1A illustrates a perspective view of a first embodiment of the present invention.
Figure 1B:
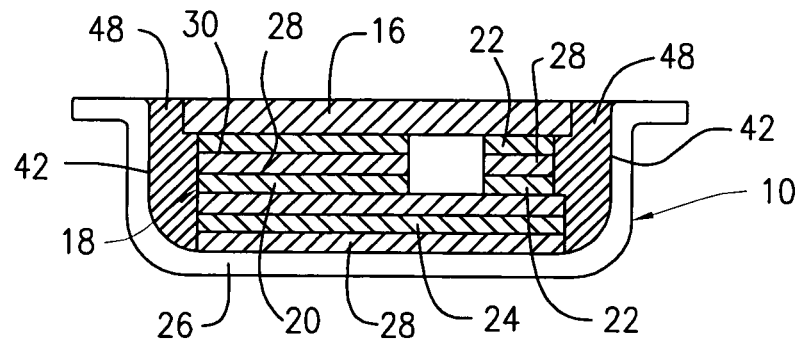
FIG. 1B illustrates a cross-sectional view along line 1B-1B viewed in the direction of the arrows.

Referring to FIG. 1A, a semiconductor package according to the first preferred embodiment of the present invention includes a first metallic clip 10, a second metallic clip 12, a third metallic clip 14, and preferably a dielectric insert 16. Preferably, a semiconductor package according to the first embodiment first clip 10 serves as the drain lead, second clip 12 serves as a source lead and third clip 14 serves as the gate lead to the drain electrode, source electrode and the gate electrode of a power MOSFET respectively. Thus, referring to FIG. 1B, a package according to the preferred embodiment includes a power MOSFET 18 having a drain electrode 24 on one surface thereof and a source electrode 20 and a gate electrode 22 on another surface thereof. First clip 10 includes a web portion 26 which includes a surface that is electrically and mechanically coupled to drain electrode 24 using a conductive adhesive 28 such a solder or a conductive epoxy, second clip 12 includes a web portion 30 having a surface which is electrically and mechanically coupled to source electrode 20 using a conductive adhesive 28 such as solder or a conductive epoxy, and third clip 14 includes a web portion 32 having a surface that is electrically and mechanically coupled to gate electrode 22 using a conductive adhesive 28 such as solder or a conductive epoxy.

Figure 2:
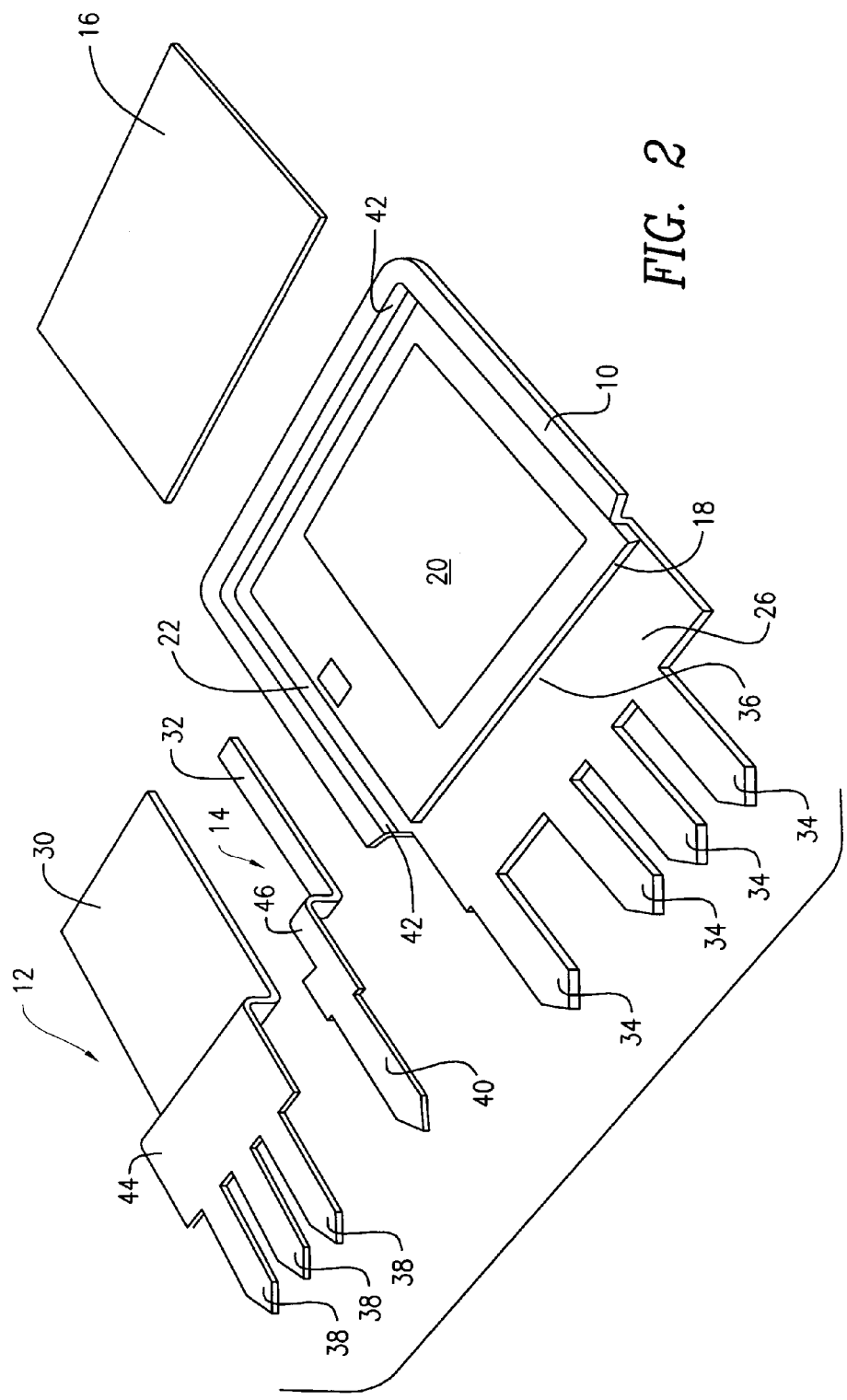
FIG. 2 is an exploded perspective view of the device of FIGS. 1A and 1B.

Referring now to FIG. 2, first clip 10 includes at least one, but preferably a plurality of external connection terminal leads 34 extending from an edge of web portion 26 thereof along a direction away from a peripheral wall 36 of power MOSFET 18, second clip 12 includes at least one, but preferably a plurality of external connection terminal leads 38 extending from an edge of web portion 30, and third clip 14 includes at least one external connection terminal lead 40 extending from an edge of web portion 32 thereof. Note that in each clip 10,12, 14 web portions 26,30,32 are unitarily integrated with terminal leads 34,38,40 thereof.

Note that preferably first clip 10 includes a wall 42 which extends from web portion 26 thereof and is spaced from and disposed opposite all peripheral walls of MOSFET 18, except peripheral wall 36 thereof. Furthermore, preferably terminals 34 may be coplanar with web portion 26, while terminals 38 and terminal 40 extend from a bent portion 44, 46 of a respective web portion 30, 32. Note that bent portions 44, 46 provide a gap wider than the thickness of MOSFET 18 and solder bodies 28 between terminals 34, 38 and 40 to avoid electrical shorting.

Dielectric insert 16 is coupled mechanically and thermally to web portions 30, 32 using an adhesive (e.g. an epoxy) in order to improve heat extraction from MOSFET 18. An epoxy filler body 48 fills the gaps between the die and wall 42 to provide protection to MOSFET 18. Insert 16 may be held in place solely by the epoxy filler material, which is subsequently deposited to seal and fill the die and clip assembly. Alternatively, insert 16 may be mechanically held in place by pressing the edges wall 42 over the top surface of insert 16.

In the first embodiment, each terminal 34, 38, 40 is configured to be inserted into a corresponding receptacle in a circuit board or the like, whereby the package is generally vertically oriented with respect to a major surface of the circuit board. Thus, a package according to the first embodiment is a plug-in type package.

Figure 3:
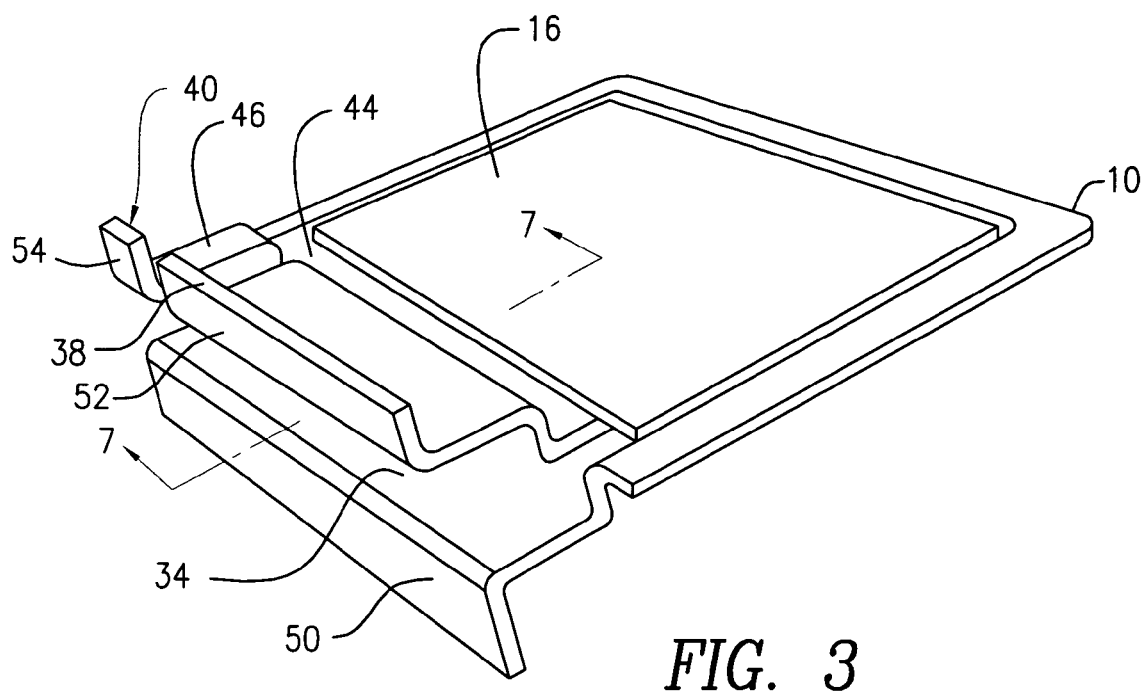
FIGS. 3 and 4 show perspective views of a second embodiment of the present invention.
Figure 4:
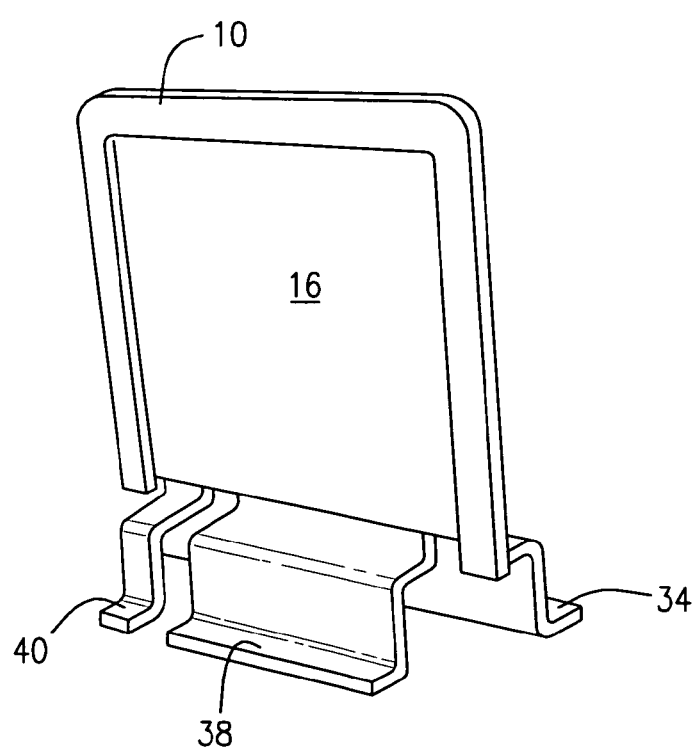

Referring now to FIGS. 3 and 4, in which like numerals identify like features, a package according to the second embodiment of the present invention includes all features of the first embodiment except that each terminal includes a connection surface 50, 52, 54 readied for electrical and mechanical using a conductive adhesive (e.g. solder or conductive epoxy) connection to an external pad of a circuit board.

Figure 5:
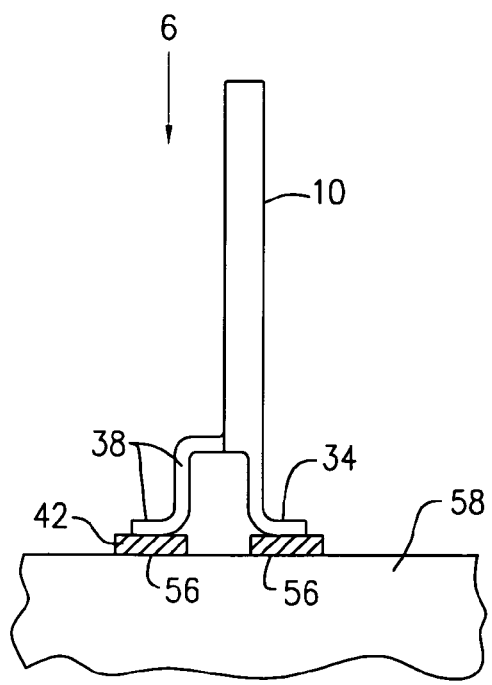
FIG. 5 shows an end view of the device of FIGS. 3 and 4 mounted vertically on a horizontal support surface (e.g. circuit board).
Figure 6:
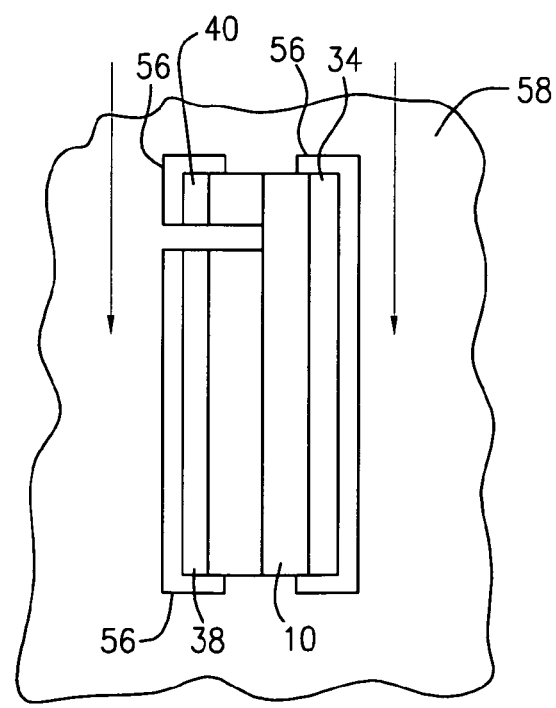
FIG. 6 is a top view of FIG. 5 (viewed in the direction of arrow 6) and shows forced air cooling of the two surfaces of the package.

Referring this to FIGS. 5 and 6, a package according to the second embodiment can be assembled onto conductive pads 56 of a circuit board 58 using a conductive adhesive as shown. Circuit board 58 may be an FR4 type circuit board. Note that both sides of the package can be cooled by convection or by forced air cooling as shown by the arrows in FIG. 6.

Figure 1C:
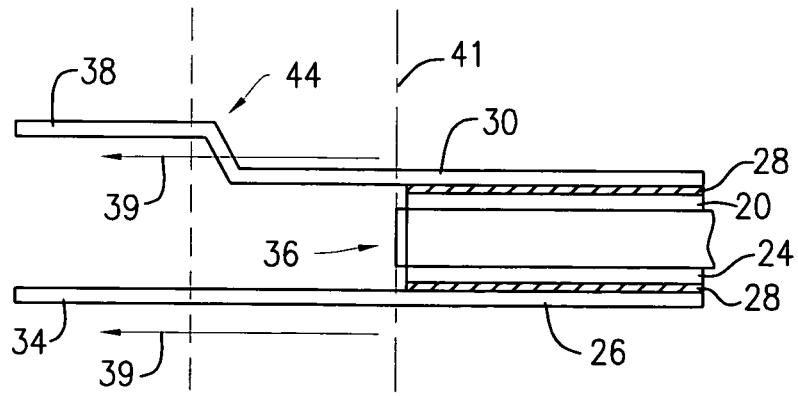
FIG. 1C illustrates a cross-sectional view along line 1C-1C viewed in the direction of the arrows.
Figure 7:
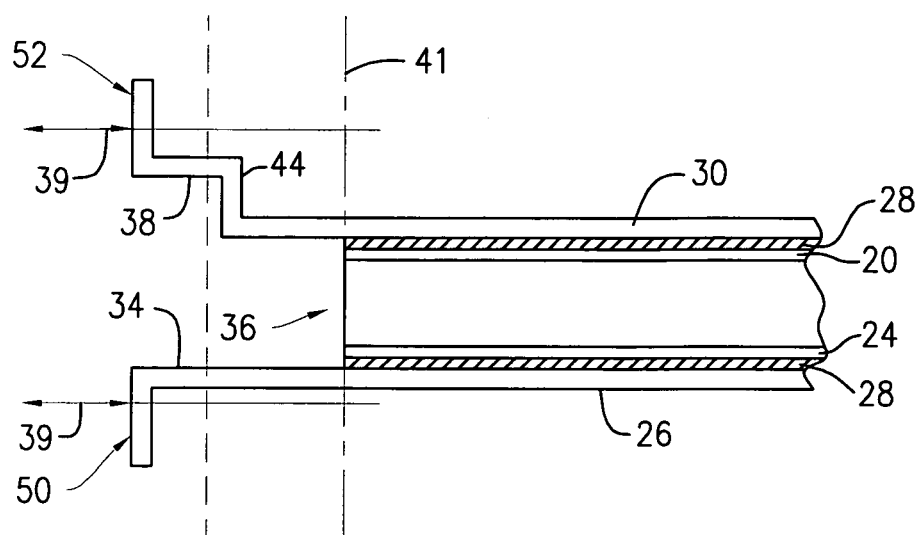
FIG. 7 is a cross-sectional view along line 7-7 viewed in the direction of the arrows.

Referring now to FIGS. 1C and 7, in order to render a package according to the present invention vertically mountable each terminal 34,38, and 40 extends along a direction 39 having a vector that pierces the plane 41 along the surface of peripheral wall 36 of MOSFET 18. Note further than preferably the distance between terminals 34 and 38 and 40 is more than the thickness of MOSFET 18.

Note that although in the preferred embodiment a MOSFET is used an IGBT or even a diode (without a third clip) may be packaged without deviating from the scope and spirit of the present invention.

Further note that insert 16 may be formed with a thermally conductive ceramic as well as a thermally conductive glass.

A package according to the present invention, is a higher performance, lower cost alternative to TO220 type packages.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor package, comprising:
   a power MOSFET having a drain electrode on one surface thereof and a source electrode on another opposite surface thereof;
   a first metallic clip that includes a first web portion having a surface electrically and mechanically coupled to said drain electrode by a conductive adhesive, and a first plurality of external connection terminal leads extending from an edge of and substantially coplanar to said first web portion along a direction away from a peripheral wall of said power MOSFET;
   said first metallic clip further including a wall that extends from said first web portion and is spaced from and disposed opposite said peripheral wall of said power MOSFET; and
   a second metallic clip that includes a second web portion having a surface electrically and mechanically coupled to said source electrode by a conductive adhesive, and at least a second external connection terminal lead extending from an edge of said second web portion along said direction away from said peripheral wall of said power MOSFET.

2. The semiconductor package of claim 1, further comprising a gate electrode on said another opposite surface of said power MOSFET and a third metallic clip that includes a third web portion having a surface electrically and mechanically coupled to said gate electrode by a conductive adhesive, and at least one third external connection terminal lead extending from an edge of said third web portion along said direction away from said peripheral wall of said power MOSFET.

3. The semiconductor package of claim 2, further comprising a thermally conductive dielectric insert thermally coupled to said second and third metallic clips.

4. The semiconductor package of claim 3, wherein said thermally conductive dielectric insert comprises a ceramic.

5. The semiconductor package of claim 3, wherein said thermally conductive dielectric insert comprises glass.

6. The semiconductor package of claim 3, further comprising a filler body sealing said power MOSFET.

7. The semiconductor package of claim 3, wherein said thermally conductive dielectric insert is mechanically coupled to said first metallic clip.

8. The semiconductor package of claim 2, wherein each said external connection terminal lead includes a respective connection surface readied for connection to an external pad of a circuit board using a conductive adhesive.

9. The semiconductor package of claim 2, wherein each said external connection terminal lead is configured for insertion in a respective receptacle on a circuit board.

10. The semiconductor package of claim 1, wherein each said first plurality of external connection terminal leads and said second external connection terminal lead includes a respective connection surface readied for connection to a conductive pad of a circuit board using a conductive adhesive.

11. The semiconductor package of claim 1, wherein each said first plurality of external connection terminal leads and said second external connection terminal lead is configured for insertion in a respective receptacle of a circuit board.

12. A semiconductor package, comprising:
    a power MOSFET having a drain electrode on one surface thereof and a source electrode on another opposite surface thereof;
    a first metallic clip that includes a first web portion having a surface electrically and mechanically coupled to said drain electrode by a conductive adhesive, and a first plurality of external connection terminal leads extending .from an edge of and substantially coplanar to said first web portion along a direction away from a peripheral wall of said power MOSFET;
    said first metallic clip further including a wall that extends from said first web portion and is spaced from and disposed opposite said peripheral wall of said power MOSFET; and
    a second metallic clip that includes a second web portion having a surface electrically and mechanically coupled to said source electrode by a conductive adhesive, and at least a second external connection terminal lead extending from an edge of a bent portion of said second web portion along said direction away from said peripheral wall of said power MOSFET, wherein said bent portion of said second web portion provides a gap wider than the thickness of said power MOSFET between said second external connection terminal lead and said first plurality of external connection terminal leads.

13. The semiconductor package of claim 12, further comprising a gate electrode on said another opposite surface of said power MOSFET and a third metallic clip that includes a third web portion having a surface electrically and mechanically coupled to said gate electrode by a conductive adhesive, and at least one third external connection terminal lead extending from an edge of a bent portion of said third web portion along said direction away from said peripheral wall of said power MOSFET, wherein said bent portion provides a gap wider than the thickness of said power MOSFET between said third external connection terminal lead and said first plurality of external connection terminal leads.

14. The semiconductor package of claim 13, further comprising a thermally conductive dielectric insert thermally coupled to said second and third metallic clips.

15. The semiconductor package of claim 12, wherein each said external connection terminal lead includes a respective connection surface readied for connection to an external pad of a circuit board using a conductive adhesive.

* * * * *